(12) United States Patent
Chang et al.

(10) Patent No.: US 11,545,557 B2
(45) Date of Patent: Jan. 3, 2023

(54) SEMICONDUCTOR DEVICE AND FABRICATION METHOD THEREOF

(71) Applicant: UNITED MICROELECTRONICS CORP., Hsin-Chu (TW)

(72) Inventors: Chia-Wei Chang, Tainan (TW); Chia-Ming Kuo, Kaohsiung (TW); Po-Jen Chuang, Kaohsiung (TW); Fu-Jung Chuang, Kaohsiung (TW); Shao-Wei Wang, Taichung (TW); Yu-Ren Wang, Tainan (TW); Chia-Yuan Chang, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 23 days.

(21) Appl. No.: 17/225,066

(22) Filed: Apr. 7, 2021

(65) Prior Publication Data
US 2022/0302279 A1 Sep. 22, 2022

(30) Foreign Application Priority Data
Mar. 19, 2021 (TW) .................. 110110033

(51) Int. Cl.
*H01L 29/49* (2006.01)
*H01L 29/78* (2006.01)
*H01L 29/08* (2006.01)
*H01L 29/24* (2006.01)
*H01L 29/66* (2006.01)
*H01L 21/02* (2006.01)
*H01L 21/28* (2006.01)

(52) U.S. Cl.
CPC ...... *H01L 29/4983* (2013.01); *H01L 21/0234* (2013.01); *H01L 21/02332* (2013.01); *H01L 21/02521* (2013.01); *H01L 21/28123* (2013.01); *H01L 29/0847* (2013.01); *H01L 29/24* (2013.01); *H01L 29/66545* (2013.01); *H01L 29/66795* (2013.01); *H01L 29/7851* (2013.01)

(58) Field of Classification Search
CPC .......... H01L 29/4983; H01L 21/02332; H01L 21/0234; H01L 21/02521; H01L 21/28123; H01L 29/0847; H01L 29/24; H01L 29/66545; H01L 29/66795; H01L 29/7851
See application file for complete search history.

(56) References Cited

U.S. PATENT DOCUMENTS

2020/0043793 A1* 2/2020 Huang .................. H01L 29/785
2020/0126979 A1* 4/2020 Ching ................. H01L 27/0886
2020/0176591 A1* 6/2020 Wong ................ H01L 29/66795

* cited by examiner

*Primary Examiner* — Julia Slutsker
(74) *Attorney, Agent, or Firm* — Winston Hsu

(57) ABSTRACT

A semiconductor device includes substrate having a fin structure thereon, a gate structure overlying the fin structure, a polymer block at a corner between the gate structure and the fin structure, and a source/drain region on the fin structure. The polymer block includes a nitridation layer in proximity to a sidewall of the gate structure.

6 Claims, 6 Drawing Sheets

SEMICONDUCTOR DEVICE AND FABRICATION METHOD THEREOF

BACKGROUND OF THE INVENTION

1. Field of the Invention

The present invention relates to the field of semiconductor technology, and particularly relates to a semiconductor fin-type field effect transistor (FinFET) device and a manufacturing method thereof.

2. Description of the Prior Art

As the size of integrated circuits has decreased, the demand for transistors with high drive current and small size has increased, and fin-shaped field-effect transistors (Fin-FETs) have been developed. The channel of the FinFET device is formed on the sidewall and top surface of the fin, so that the FinFET device has a larger channel width, which can increase the driving current of the transistor.

To form the FinFET device, typically, a silicon layer on the surface of the substrate is patterned by etching to form a fin-shaped silicon structure, and then an insulating layer and dummy polysilicon gate are formed on the fin-shaped silicon structure. An ion implantation process and an anneal process may be performed to form the source/drain regions in the fin-shaped silicon structure. Subsequently, an epitaxial layer such as SiP is formed in the source/drain regions by using an epitaxial process. A replacement metal gate (RMG) process is then performed to replace the dummy polysilicon gate with a metal gate.

However, in the existing practice, when the dummy polysilicon gate is removed, the SiP epitaxial layer in the source/drain region may also be etched away, which results in hole defects in the source/drain region and reduction of yield.

SUMMARY OF THE INVENTION

It is one purpose of the present invention to provide a semiconductor device and a manufacturing method thereof to solve the above-mentioned drawbacks or shortcomings of the prior art.

One aspect of the invention provides a semiconductor device including a substrate having a fin structure; a gate structure overlying the fin structure; a polymer block at a corner between the gate structure and the fin structure, wherein the polymer block comprises a nitridation layer in proximity to a sidewall of the gate structure; and a source/drain region on the fin structure.

According to some embodiments, the nitridation layer comprises a nitrided silicon oxide film.

According to some embodiments, the polymer block comprises a silicon oxide layer on the nitrided silicon oxide film.

According to some embodiments, the gate structure is a metal gate.

According to some embodiments, the source/drain region comprises a SiP epitaxial layer.

According to some embodiments, the fin structure is disposed above a trench isolation region.

According to some embodiments, the semiconductor device further comprises a seal layer on a sidewall of the gate structure and on the polymer block.

According to some embodiments, the seal layer comprises a carbon-doped silicon oxynitride layer.

Another aspect of the invention provides a method of forming a semiconductor device. A substrate having a fin structure is provided. A dummy gate is formed on the fin structure. A polymer block is formed adjacent to a corner between the dummy gate and the fin structure. The polymer block is subjected to a nitrogen plasma treatment, thereby forming a nitridation layer in proximity to a sidewall of the dummy gate under the polymer block. After subjecting the polymer block to the nitrogen plasma treatment, a seal layer is formed on the sidewall of the dummy gate and on the polymer block. An epitaxial layer is then grown on a source/drain region of the fin structure. The dummy gate is then replaced with a metal gate.

According to some embodiments, the nitridation layer comprises a nitrided silicon oxide film.

According to some embodiments, the polymer block comprises a silicon oxide layer on the nitrided silicon oxide film.

According to some embodiments, the epitaxial layer comprises SiP.

According to some embodiments, the dummy gate is a dummy polysilicon gate.

According to some embodiments, the seal layer comprises a carbon-doped silicon oxynitride layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams showing a method for fabricating a semiconductor device according to an embodiment of the present invention, wherein FIG. 1 is a top view of the semiconductor device according to an embodiment of the present invention, and FIG. 2 to FIG. 6 are side perspective views of a semiconductor device according to an embodiment of the present invention.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present invention pertains to a semiconductor fin field effect transistor (FinFET) device and a manufacturing method thereof. As mentioned above, to form the FinFET device, a silicon layer on the surface of the substrate is patterned by etching to form a fin-shaped silicon structure, and then an insulating layer and dummy polysilicon gate are formed on the fin-shaped silicon structure. An ion implantation process and an anneal process may be performed to form the source/drain regions in the fin-shaped silicon structure. Subsequently, an epitaxial layer such as SiP is formed in the source/drain regions by using an epitaxial process. A replacement metal gate (RMG) process is then performed to replace the dummy polysilicon gate with a metal gate.

However, in the existing practice, when the dummy polysilicon gate is removed, the SiP epitaxial layer in the source/drain region may also be etched away, which results in hole defects in the source/drain region and reduction of yield. The present invention addresses this issue.

Figure 1:
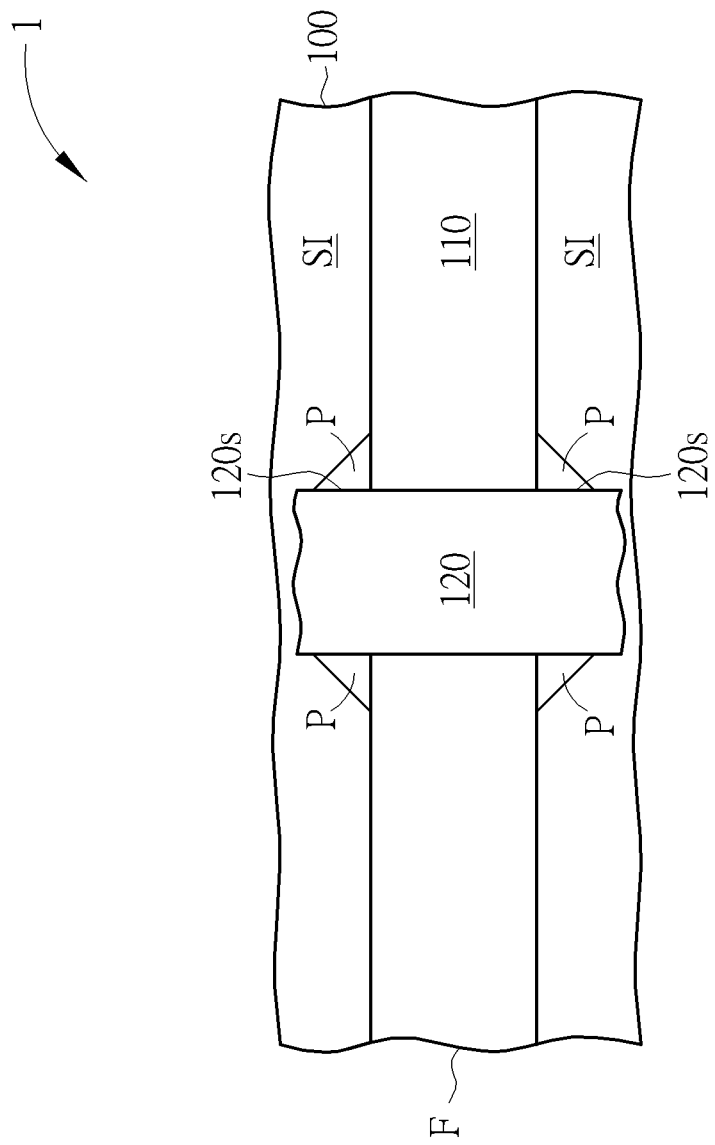

Please refer to FIG. 1 to FIG. 6, which are schematic diagrams of the manufacturing method of the semiconductor device 1 according to an embodiment of the present invention, wherein FIG. 1 is a top view of the semiconductor device 1 according to an embodiment of the present invention, FIG. 2 to FIG. 6 are side perspective views of the semiconductor device 1 according to an embodiment of the present invention.

Figure 2:
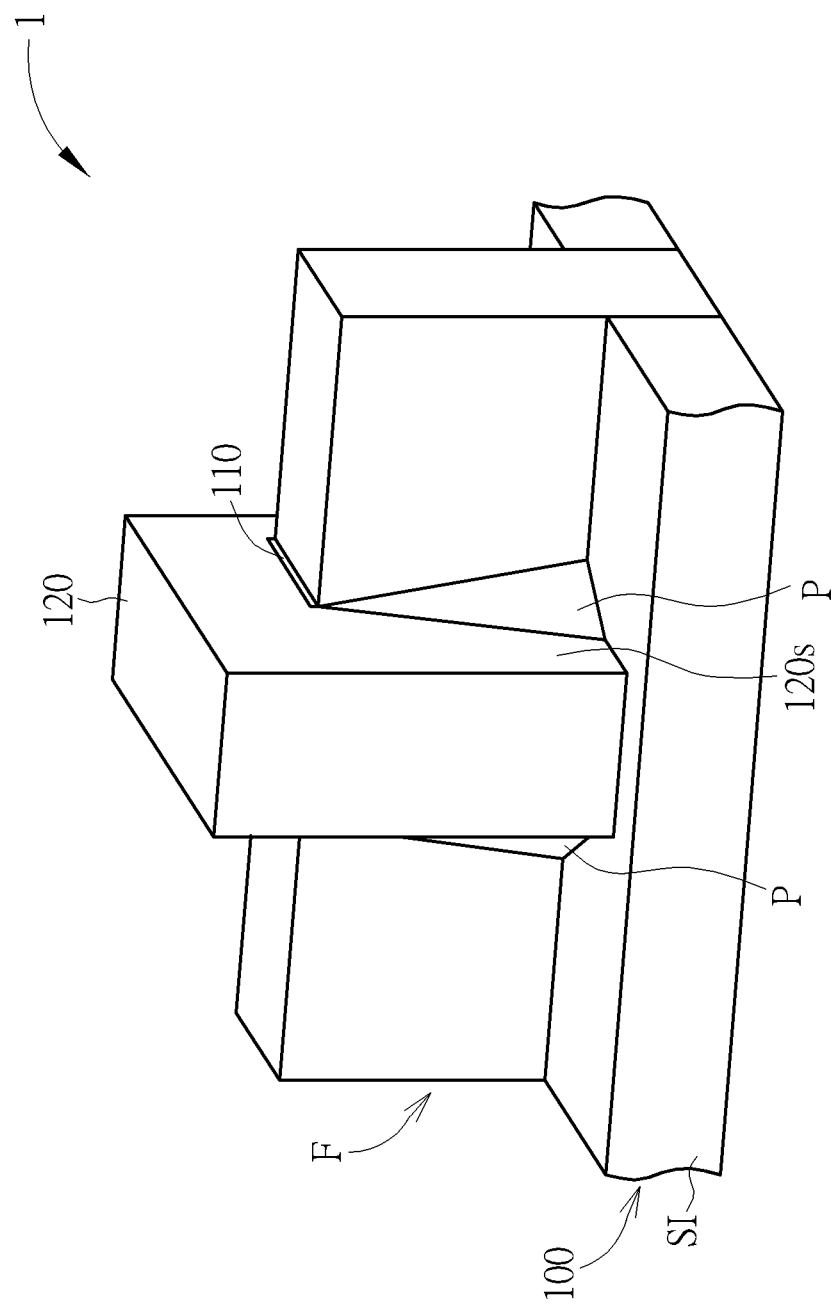

As shown in FIG. 1 and FIG. 2, a substrate 100, for example, a semiconductor substrate is provided. A fin structure F, for example, a fin-like silicon structure is formed on the substrate 100. A gate dielectric layer 110 is then formed on the fin structure F. A dummy gate 120, for example, a dummy polysilicon gate is then formed on the gate dielectric layer 110. According to an embodiment of the present invention, the fin structure F is disposed above a trench isolation region SI.

At this point, a polymer block P, also known as fin corner oxide (FCO), is formed at the corner between the sidewall 120s of the dummy gate 120 and the fin structure F. The above-mentioned polymer block P may be mainly composed of silicon oxide formed by oxidation of residual silicon when the dummy polysilicon gate 120 is formed. Subsequently, during the removal step of the dummy gate 120, the etchant may etch the polymer block P and cause the SiP epitaxial layer in the source/drain region to be etched. A hole defect may be formed in the source/drain region.

Figure 3:
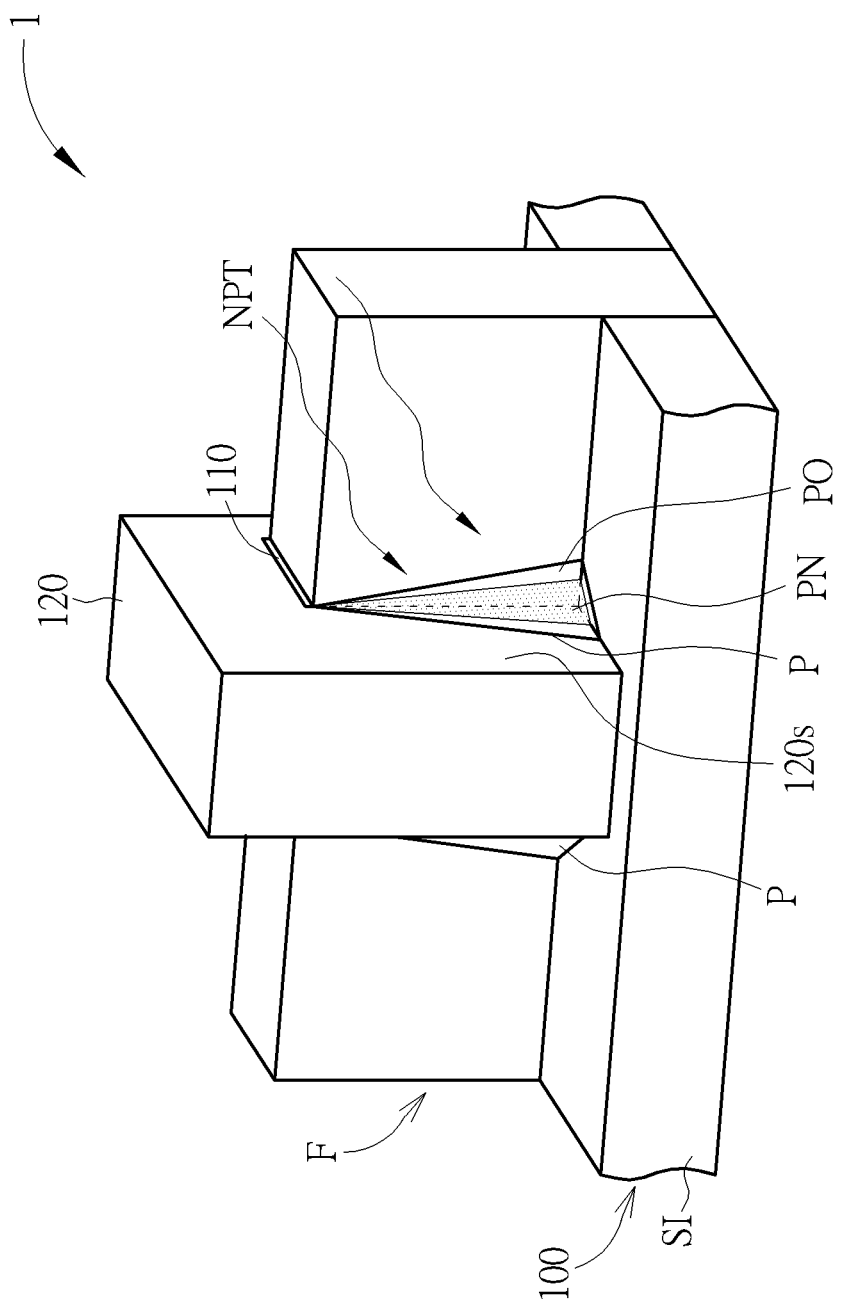

As shown in FIG. 3, the polymer block P is subjected to a nitrogen plasma treatment NPT, nitrogen ions may penetrate through the polymer block P, and a nitride layer PN may be formed under the polymer block P and in proximity to the sidewall 120s of the dummy gate 120. According to an embodiment of the present invention, the nitridation layer PN includes a nitrided silicon oxide film. According to an embodiment of the present invention, the polymer block P may include a silicon oxide layer PO on the nitrided silicon oxide film.

Figure 4:
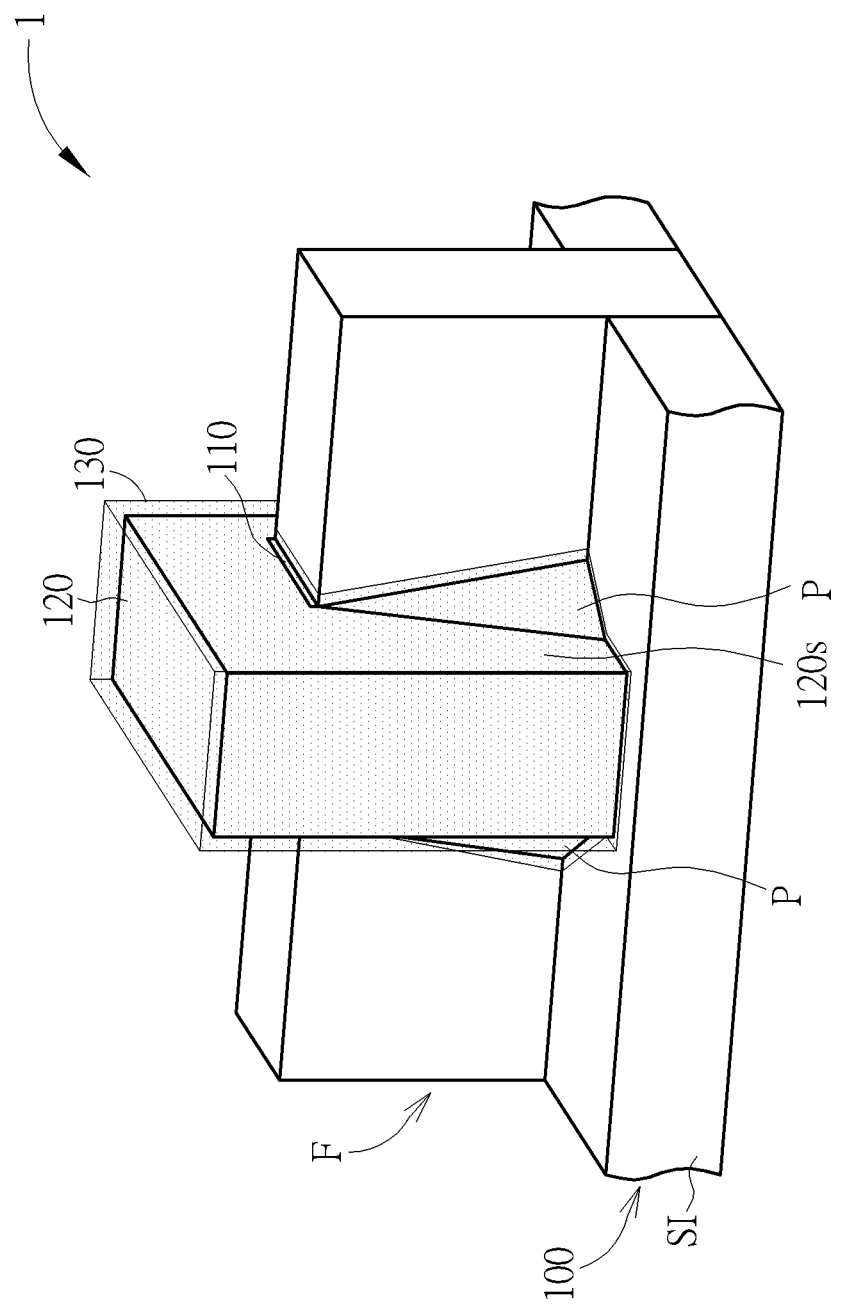

As shown in FIG. 4, after the polymer block P is treated with nitrogen plasma, a sealing layer 130 is formed on the sidewall 120s of the dummy gate 120 and on the polymer block P. According to an embodiment of the present invention, the sealing layer 130 may include a carbon-doped silicon oxynitride (SiOCN) layer, but is not limited thereto.

Figure 5:
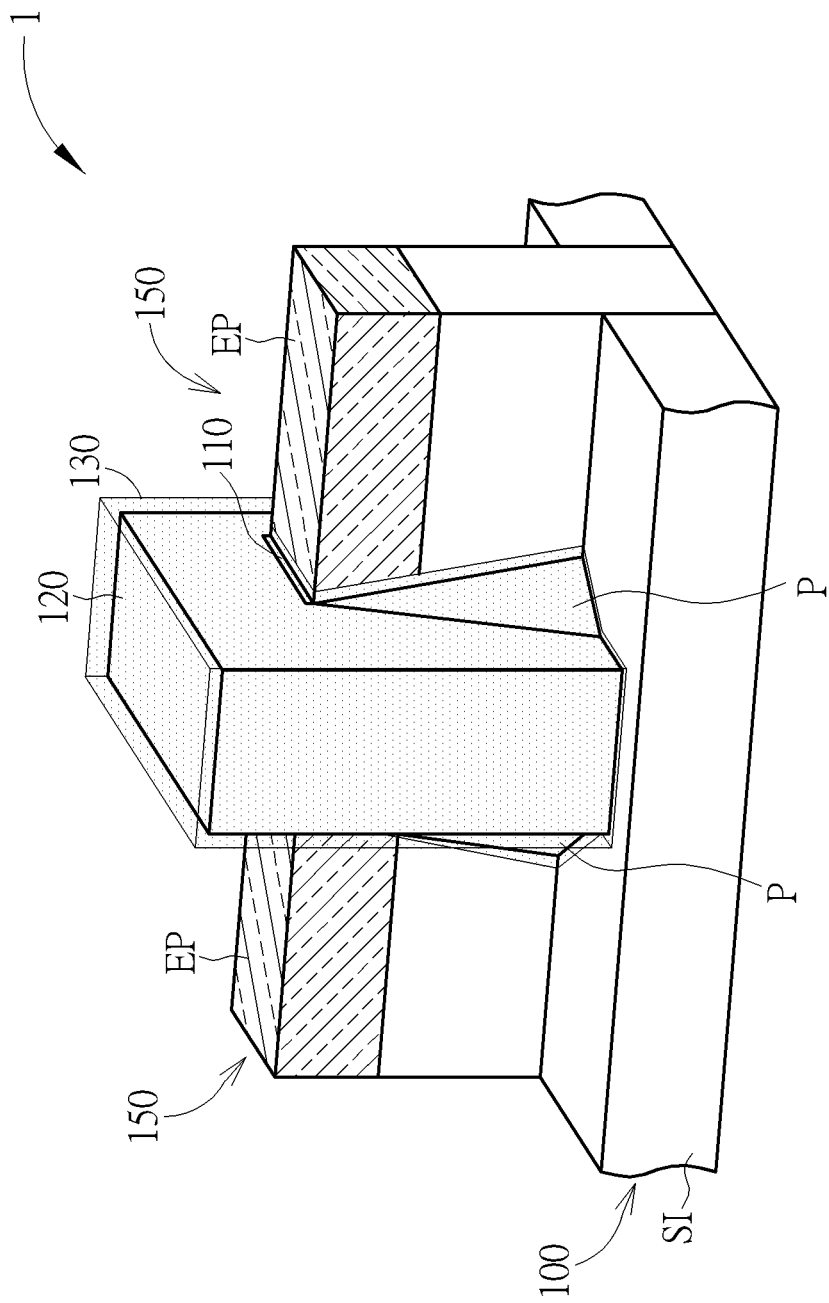

As shown in FIG. 5, an epitaxial layer EP is then grown on a source/drain region 150 of the fin structure F. According to an embodiment of the present invention, the epitaxial layer EP may include SiP.

Figure 6:
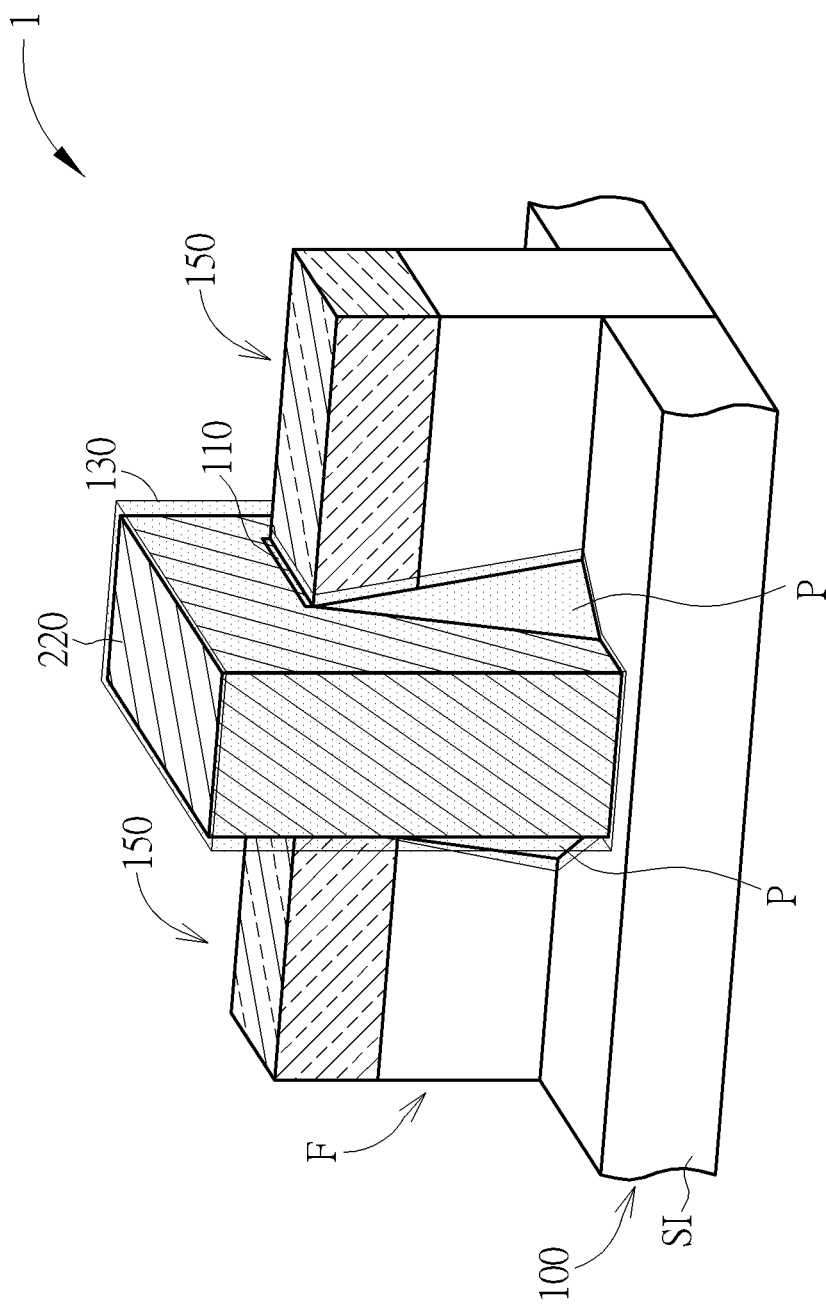

As shown in FIG. 6, an RMG process is performed to replace the dummy gate 120 with a metal gate 220. Since the above-mentioned RMG process is a well-known technology, its details will not be repeated. For example, the above-mentioned RMG process may include a dummy poly removal (DPR) step in which the dummy gate 120 is removed by etching. During the DPR step, the nitridation layer PN can resist etching, so the SiP epitaxial layer in the source/drain regions will not be etched away, and therefore no hole defects will be formed in the source/drain regions 150.

Structurally, it can be seen from FIG. 3 and FIG. 6 that a semiconductor device 1 of the present invention includes a substrate 100 having a fin structure F, a gate structure 220 covering the fin structure F, and a polymer block P at a corner between the gate structure 220 and the fin structure F, and a source/drain region 150 located on the fin structure F. The polymer block P includes a nitridation layer PN adjacent to a sidewall of the gate structure 220.

According to an embodiment of the present invention, as shown in FIG. 3, the nitridation layer PN includes a nitrided silicon oxide film. According to an embodiment of the present invention, the polymer block P includes a silicon oxide layer PO on the nitrided silicon oxide film.

According to an embodiment of the present invention, the gate structure 220 is a metal gate. According to an embodiment of the present invention, the source/drain region 150 includes a SiP epitaxial layer EP. According to an embodiment of the present invention, the fin structure F is disposed above a trench isolation region SI.

According to an embodiment of the present invention, the semiconductor device 1 further includes a seal layer 130 disposed on the sidewall of the gate structure 220 and on the polymer block P. According to an embodiment of the present invention, the seal layer 130 includes a carbon-doped silicon oxynitride layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having a fin structure;
    a gate structure overlying the fin structure;
    a polymer block at a corner between the gate structure and the fin structure, wherein the polymer block comprises a lower nitridation layer in proximity to a sidewall of the gate structure and an upper silicon oxide layer masking the lower nitrided film;
    a source/drain region on the fin structure; and
    a seal layer on a sidewall of the gate structure, wherein the seal layer completely masks the polymer block.

2. The semiconductor device according to claim 1, wherein the lower nitridation layer comprises a nitrided silicon oxide film.

3. The semiconductor device according to claim 1, wherein the gate structure is a metal gate.

4. The semiconductor device according to claim 1, wherein the source/drain region comprises a SiP epitaxial layer.

5. The semiconductor device according to claim 1, wherein the fin structure is disposed above a trench isolation region.

6. The semiconductor device according to claim 1, wherein the seal layer comprises a carbon-doped silicon oxynitride layer.

* * * * *